United States Patent
Minamino et al.

(10) Patent No.: US 7,339,861 B2
(45) Date of Patent: Mar. 4, 2008

(54) PLL CLOCK GENERATOR, OPTICAL DISC DRIVE AND METHOD FOR CONTROLLING PLL CLOCK GENERATOR

(75) Inventors: Junichi Minamino, Nara (JP); Kohei Nakata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 523 days.

(21) Appl. No.: 10/824,264

(22) Filed: Apr. 14, 2004

(65) Prior Publication Data

US 2004/0207475 A1    Oct. 21, 2004

(30) Foreign Application Priority Data

Apr. 21, 2003   (JP)   ............... 2003-115547

(51) Int. Cl.
  G11B 57/09    (2006.01)
  H03L 7/06    (2006.01)
(52) U.S. Cl. ............. 369/47.28; 331/16; 327/159
(58) Field of Classification Search ............. 331/16, 331/17; 369/47.28; 327/159; H03L 7/00, H03L 7/06; G11B 5/09
See application file for complete search history.

(56) References Cited

U.S. PATENT DOCUMENTS

| | | | |
|---|---|---|---|
| 6,236,629 B1 * | 5/2001 | Hisakado et al. | 369/47.32 |
| 6,661,294 B2 * | 12/2003 | Terashima et al. | 331/17 |
| 7,012,865 B2 * | 3/2006 | Deguchi et al. | 369/47.3 |
| 2003/0002406 A1 * | 1/2003 | Deguchi et al. | |
| 2003/0062957 A1 | 4/2003 | Terashima et al. | |
| 2004/0027940 A1 * | 2/2004 | Minamino et al. | |

FOREIGN PATENT DOCUMENTS

JP        10-228730 A    8/1998

* cited by examiner

*Primary Examiner*—Aristotelis M. Psitos
(74) *Attorney, Agent, or Firm*—Panitch Schwarze Belisario & Nadel LLP

(57) ABSTRACT

A PLL clock generator generates an output signal with a frequency N times (where N≧1) as high as that of an input signal. The clock generator includes: a frequency divider for dividing the frequency of a clock signal by N so as to output a frequency-divided clock signal; a phase comparator for detecting a phase difference between the input signal and the output signal of the frequency divider so as to output a phase difference signal including information representing the phase difference; a LPF for smoothing the phase difference signal; a VCO for generating the clock signal, of which the frequency is determined by the output of the LPF, and outputting the clock signal to the frequency divider; and a phase shifter for shifting the phase of the output signal of the frequency divider in accordance with the phase difference signal.

10 Claims, 7 Drawing Sheets

PLL CLOCK GENERATOR, OPTICAL DISC DRIVE AND METHOD FOR CONTROLLING PLL CLOCK GENERATOR

BACKGROUND OF THE INVENTION

1. Field of the Invention

The present invention relates to a phase-locked loop (PLL) and more particularly relates to a PLL clock generator for generating clock pulses by reading a wobbling pattern on a given optical disc and to an optical disc drive including such a PLL clock generator.

2. Description of the Related Art

A recordable or rewritable optical disc such as a DVD-RAM, a DVD-R or a DVD-RW (which will be referred to herein as a "recordable optical disc" collectively) has spiral data recording tracks that wobble. A light beam that has been emitted toward, and reflected from, one of those recordable optical discs includes information representing modulation caused by the wobbling pattern on the optical disc (which will be referred to herein as "wobbling information"). A conventional optical disc drive generates a PLL multiplier clock signal in accordance with this wobbling information and uses that clock signal to perform a write operation synchronously with a clock pulse, to keep the linear velocity, at which the light beam scan the tracks, constant, or the like.

FIG. 7 is a block diagram showing a PLL clock generator 500 for use in a conventional optical disc drive. As shown in FIG. 7, when a wobble signal including wobbling information is input to the PLL clock generator 500, a binarizer 501 compares the level of the input signal with a predetermined zero level. If the level of the input signal is lower than that predetermined zero level, the binarizer 501 outputs "0". On the other hand, if the level of the input signal is equal to or higher than the predetermined zero level, then the binarizer 501 outputs "1". In this manner, a binary signal can be obtained.

A phase comparator 502 derives a phase difference between the binary signal and the output signal of a frequency divider 506 and outputs the difference as a phase error signal. More specifically, if the phase of the output signal of the frequency divider 506 is behind that of the binary signal, then the phase comparator 502 outputs an up signal of which the width represents the phase difference. On the other hand, if the phase of the output signal of the frequency divider 506 is ahead of that of the binary signal, then the phase comparator 502 outputs a down signal of which the width represents the phase difference. A charge pump 509 pumps current into a capacitor in a low pass filter 503 in response to the up signal and pumps out current from the capacitor in response to the down signal.

In response to the current that has been pumped out from, or pumped into, the capacitor by the charge pump 509, the low pass filter 503 performs a smoothing operation, thereby outputting a control voltage. Then, a VCO 504 outputs a clock signal of which the frequency is determined by the control voltage. On receiving the clock signal, the frequency divider 506 divides the frequency of the clock signal, thereby outputting a frequency-divided signal to the phase comparator 502. In this case, if the output signal of the frequency divider 506 has a phase lead, then the VCO 504 delays the phase of the clock signal by decreasing its oscillation frequency. On the other hand, if the output signal of the frequency divider 506 has a phase lag, then the VCO 504 advances the phase of the clock signal by increasing its oscillation frequency.

As a result of this operation, the PLL clock generator 500 generates a wobble clock signal, of which the frequency is n times as high as that of the input wobble signal (where n is determined by the frequency divider 506) and which is synchronized in phase with the binary signal. For example, if the input wobble signal has a frequency of 957 kHz and if the frequency divider 506 divides the frequency by 69 (i.e., when n=69), then the PLL clock generator 500 generates a wobble clock signal with a frequency of 66 MHz (=957 kHz×69). The optical disc drive will use this wobble clock signal as a write clock signal, a reference clock signal to generate various timing signals, and a reference clock signal to control a spindle motor.

In the PLL clock generator 500, the low pass filter 503 is designed so as to satisfy the response characteristic that the PLL clock generator 500 should exhibit. Generally speaking, to minimize the jitter of the wobble clock signal, the low pass filter 503 needs to have a lower cutoff frequency. However, if the cutoff frequency of the low pass filter 503 is decreased, then it will take a longer time for the PLL clock generator to accomplish phase locking or the capture range (i.e., a frequency range in which phase locking can be accomplished) may narrow. That is to say, some tradeoff is inevitable between the jitter minimization of the wobble clock signal and the time it takes to accomplish phase locking in the PLL clock generator or the phase-locking frequency range.

Thus, to overcome both of these problems at the same time, Japanese Laid-Open Publications Nos. 2001-126250 and 10-228730 disclose a technique of setting the loop gain of a PLL (which is normally represented by the amount of current pumped by the charge pump 509) relatively high during a phase locking operation and relatively low during a normal operation, respectively.

However, to switch the loop gain of the PLL in this manner, a circuit for changing the amounts of current to be pumped by the charge pump is needed, thus increasing the overall circuit scale unintentionally. Furthermore, if the response of the PLL is accelerated by increasing the loop gain thereof, then the PLL will have a decreased phase margin and easily lose its stability (e.g., phase locking state once accomplished collapses easily). For that reason, the gain cannot be increased excessively.

SUMMARY OF THE INVENTION

In order to overcome the problems described above, preferred embodiments of the present invention provide a PLL clock generator, which has a simple configuration but which can accomplish phase locking quickly enough with the jitter minimized, and also provide an optical disc drive including such a PLL clock generator.

A PLL clock generator according to a preferred embodiment of the present invention preferably generates an output signal, of which the frequency is N times (where N is a natural number equal to or greater than 1) as high as that of an input signal. The clock generator preferably includes a frequency divider, a phase comparator, a low pass filter, a voltage-controlled oscillator, and a phase shifter. The frequency divider preferably divides the frequency of a clock signal by N so as to output a frequency-divided clock signal. The phase comparator preferably detects a phase difference between the input signal and the output signal of the frequency divider so as to output a phase difference signal including information representing the phase difference. The low pass filter preferably smoothes the phase difference signal. The voltage-controlled oscillator preferably generates the clock signal, of which the frequency is determined by the output of the low pass filter, and outputs it to the frequency divider. And the phase shifter preferably shifts the phase of the output signal of the frequency divider in accordance with the phase difference signal.

In one preferred embodiment of the present invention, the phase shifter preferably advances the phase of the output signal of the frequency divider if the phase difference is equal to or smaller than a first value and preferably delays the phase of the output signal of the frequency divider if the phase difference is equal to or greater than a second value.

In this particular preferred embodiment, the frequency divider, the phase comparator, the low pass filter and the voltage-controlled oscillator preferably together makes up a first feedback loop, while the frequency divider, the phase shifter and the phase comparator preferably together make up a second feedback loop.

A PLL clock generator according to another preferred embodiment of the present invention preferably generates an output signal, of which the frequency is N times (where N is a natural number equal to or greater than 1) as high as that of an input signal. The clock generator preferably includes a frequency divider, a phase comparator, a low pass filter, a voltage-controlled oscillator, a phase shifter, and a synchronization detector. The frequency divider preferably divides the frequency of a clock signal by N so as to output a frequency-divided clock signal. The phase comparator preferably detects a phase difference between the input signal and the output signal of the frequency divider so as to output a phase difference signal including information representing the phase difference. The low pass filter preferably smoothes the phase difference signal. The voltage-controlled oscillator preferably generates the clock signal, of which the frequency is determined by the output of the low pass filter, and outputs it to the frequency divider. And the phase shifter preferably shifts the phase of the output signal of the frequency divider in accordance with the phase difference signal. The synchronization detector preferably determine a synchronization state of a PLL based on the phase difference and instructs the phase shifter to operate in the case of an asynchronous state.

In one preferred embodiment of the present invention, the synchronization detector preferably sums up the absolute values of the phase differences, obtained from the phase comparator, for a predetermined period of time and preferably instructs the phase shifter to start to operate if a resultant summation value is equal to or greater than the predetermined value.

In another preferred embodiment, the frequency divider, the phase comparator, the low pass filter and the voltage-controlled oscillator preferably together makes up a first feedback loop, and the frequency divider, the phase shifter and the phase comparator preferably together make up a second feedback loop.

In still another preferred embodiment, the PLL clock generator according to any of the preferred embodiments of the present invention described above may further include a binarizer for outputting a binary signal by comparing an input analog signal with a predetermined signal level. In that case, the input signal is the binary signal.

An optical disc drive according to a preferred embodiment of the present invention preferably reads and/or writes data from/on an optical disc with wobbled tracks. The optical disc drive preferably includes an optical head for focusing light on one of the tracks and receiving the light that has been reflected from the track, a wobble signal generator for generating a wobble signal from an output signal of the optical head, and the PLL clock generator according to one of the preferred embodiments of the present invention described above. The PLL clock generator preferably receives the wobble signal as the analog signal.

In one preferred embodiment of the present invention, the wobbled tracks of the optical disc are preferably modulated so as to represent address information.

An optical disc controller according to a preferred embodiment of the present invention preferably includes the PLL clock generator according to any of the preferred embodiments of the present invention described above and is preferably used for an optical disc drive.

In a method for controlling a PLL clock generator according to a preferred embodiment of the present invention, the PLL clock generator preferably receives an input signal with a predetermined frequency and preferably generates an output signal, of which the frequency is N times (where N is a natural number equal to or greater than 1) as high as the predetermined frequency. In a loop for controlling the frequency of the output signal in accordance with a phase difference between the input signal and a frequency-divided signal obtained by dividing the frequency of the output signal, if the loop is under asynchronous state, the method preferably includes the step of changing the phase of the frequency-divided signal.

In one preferred embodiment of the present invention, if the loop is under asynchronous state, the method preferably includes the step of performing a feedback control so as to reduce the phase difference by changing the phase of the frequency-divided signal.

According to various preferred embodiments of the present invention described above, the phase of the output signal of the frequency divider is preferably controlled in accordance with a phase difference signal, thereby changing the response characteristic of a feedback loop, made up of the frequency divider, phase comparator, low pass filter and voltage-controlled oscillator, without switching the characteristics of the charge pump or low pass filter. Thus, it is possible to prevent the PLL clock generator from increasing its circuit scale.

In addition, the phase shifter can control the phase of the output signal of the frequency divider even outside of the phase locking range without depending on the characteristic of the charge pump or low pass filter. Accordingly, in the feedback loop consisting of the frequency divider, phase comparator, low pass filter and voltage-controlled oscillator, if the low pass filter is designed so as to minimize the jitter of the clock signal, then the capture range can be expanded and the jitter can be minimized at the same time.

Furthermore, phase locking can be accomplished quickly enough by performing a feedback control with the loop consisting of the frequency divider, phase comparator, low pass filter and voltage-controlled oscillator and by getting the phase of the output signal of the frequency divider shifted by the phase shifter.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the accompanying drawings.

EMBODIMENT 1

Figure 1:
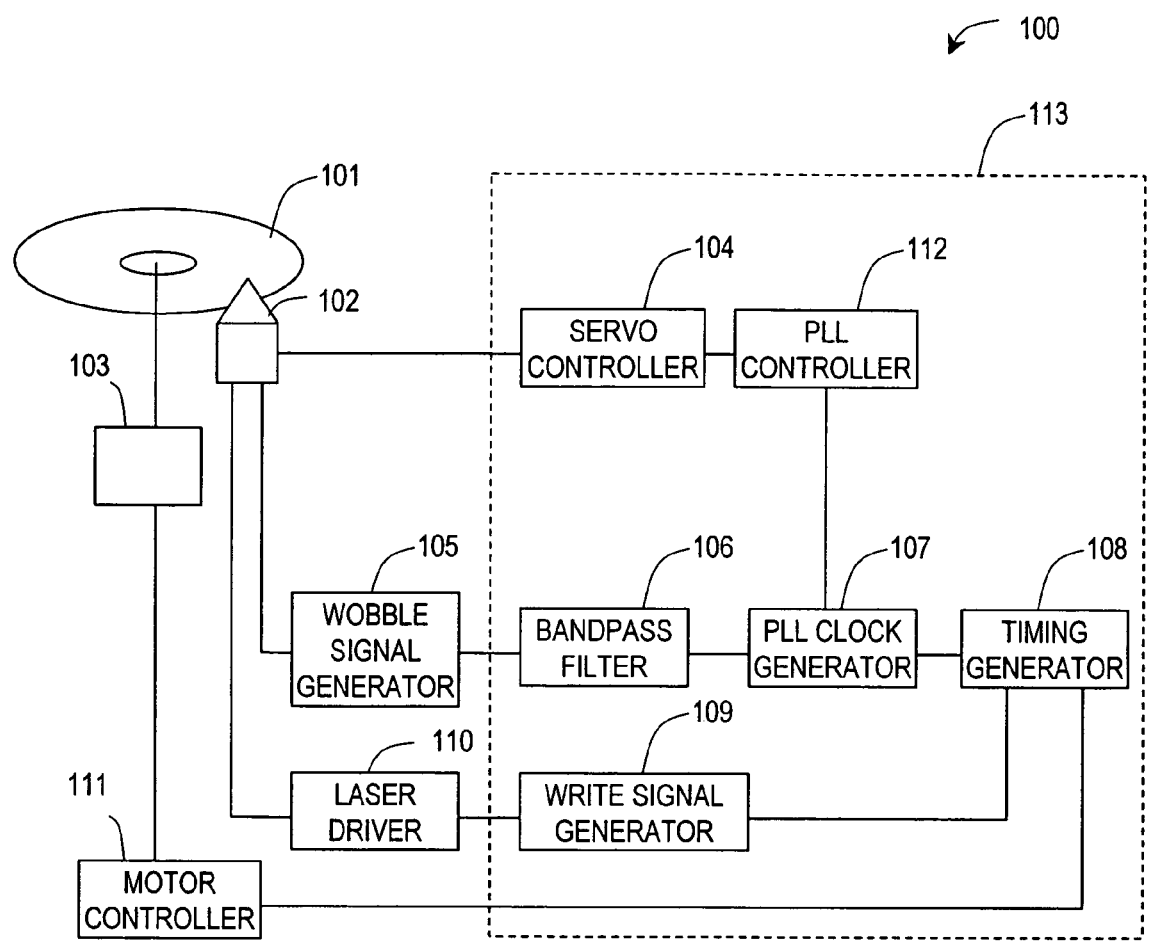
FIG. 1 is a block diagram showing a configuration for an optical disc drive according to a first specific preferred embodiment of the present invention.

FIG. 1 is a block diagram showing a configuration for an optical disc drive according to a first specific preferred embodiment of the present invention. As shown in FIG. 1, the optical disc drive preferably includes an optical head 102, a spindle motor 103, a servo controller 104, a wobble signal generator 105 and a motor controller 111.

The spindle motor 103 preferably includes a turntable to mount an optical disc 101 thereon and preferably rotates and drives the optical disc 101 under the control of the motor controller 111.

The servo controller 104 preferably performs a focus control and a tracking control on the optical head 102 such that the light emitted from the optical head 102 is focused right on the optical disc 101 and follows a target track on the disc 101 just as intended.

The optical head 102 preferably includes a photodetector (not shown), which has a number of light detecting areas that are split perpendicularly to the tracks (i.e., in the radial direction) so as to detect the light that has been reflected from the tracks. The wobble signal generator 105 preferably subjects the output signal of the photodetector to a subtraction operation, thereby generating a wobble signal. The wobble signal preferably includes a wobble frequency as its main carrier.

The optical disc drive preferably further includes a bandpass filter 106, a phase-locked loop (PLL) clock generator 107, a PLL controller 112, a timing generator 108 and a write signal generator 109. The bandpass filter 106 preferably extracts only the wobble signal from the output signal of the wobble signal generator 105 and outputs it to the PLL clock generator 107.

The PLL controller 112 preferably acquires information representing a servo control state from the servo controller 104. When the light beam emitted from the optical head 102 starts to follow the target track on the optical disc so as to allow the wobble signal generator 105 to output the wobble signal, the PLL controller 112 preferably instructs the PLL clock generator 107 to start its phase locking operation. In response, the PLL clock generator 107 preferably generates a wobble clock signal, of which the frequency is N times (e.g., N=69) as high as that of the wobble signal, and then outputs it to the timing generator 108. The wobble clock signal generated in this manner is a clock signal representing the linear velocity of the disc (i.e., the physical length of the given optical disc 101).

On receiving a write instruction from a controller (not shown), the timing generator 108 preferably outputs the wobble clock signal to the write signal generator 109. In response to the wobble clock signal as a reference clock signal, the write signal generator 109 preferably generates write data and then outputs it to a laser driver 110.

The laser driver 110 preferably drives a laser diode (not shown) included in the optical head 102, thereby writing user data on the tracks. In this case, the motor controller 111 preferably controls the rotational velocity of the spindle motor 103 such that a motor control signal, generated by getting the frequency of the wobble clock signal divided by the timing generator 108, has a constant period. As a result, the laser beam has a constant linear velocity with respect to the optical disc.

The PLL clock generator 107 preferably functions as a feedback loop for controlling the frequency of the wobble clock signal based on the phase difference between the wobble signal and the signal obtained by dividing the frequency of the wobble clock signal. In this loop, if the phase difference is equal to or greater than a predetermined value, then the PLL clock generator 107 preferably changes the phase of the frequency-divided signal directly, thereby realizing quick phase locking. Hereinafter, the structure and operation of the PLL clock generator 107 will be described in detail.

Figure 2:
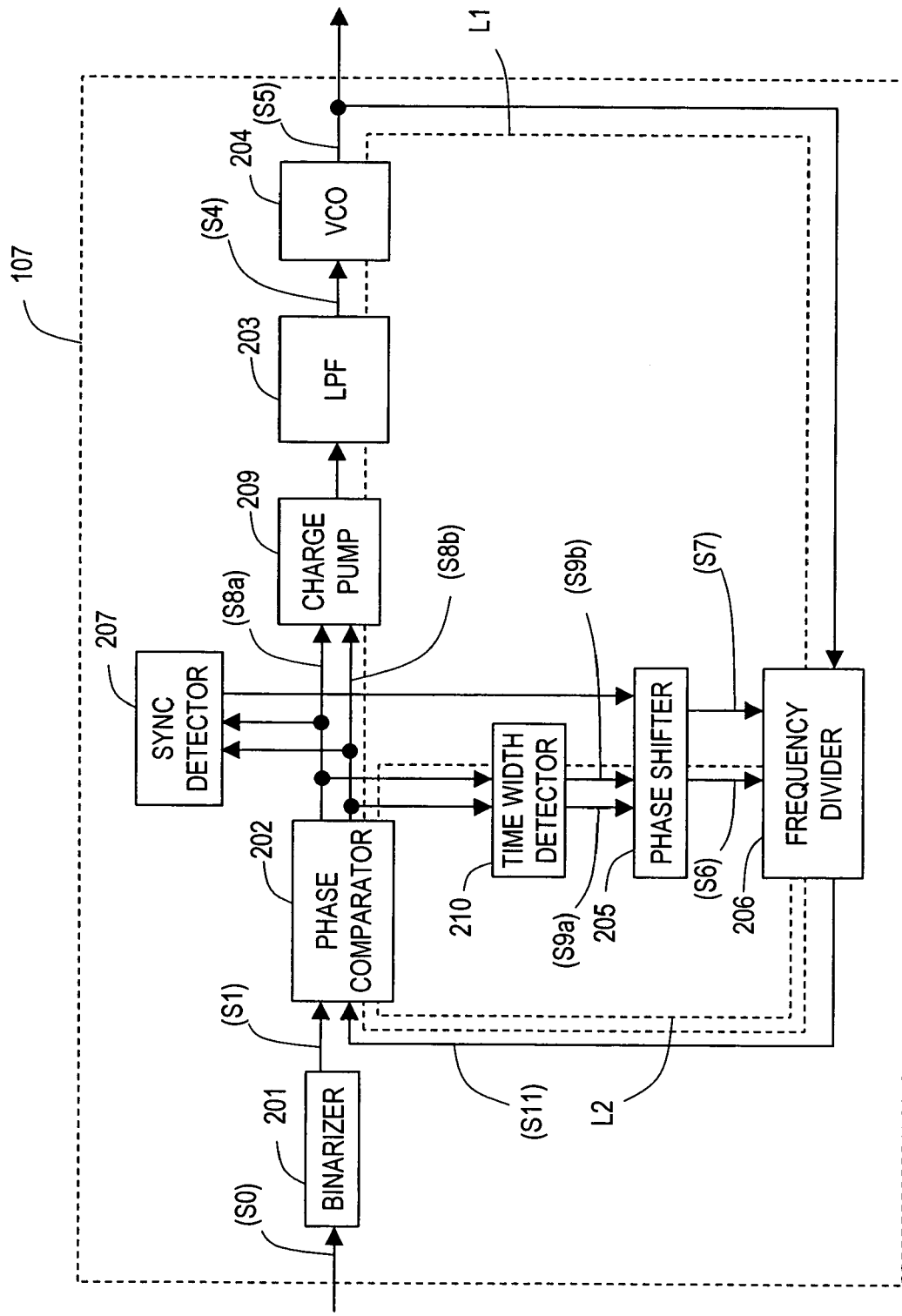
FIG. 2 is a block diagram showing a configuration for the PLL clock generator of the optical disc drive shown in FIG. 1.
Figure 3:
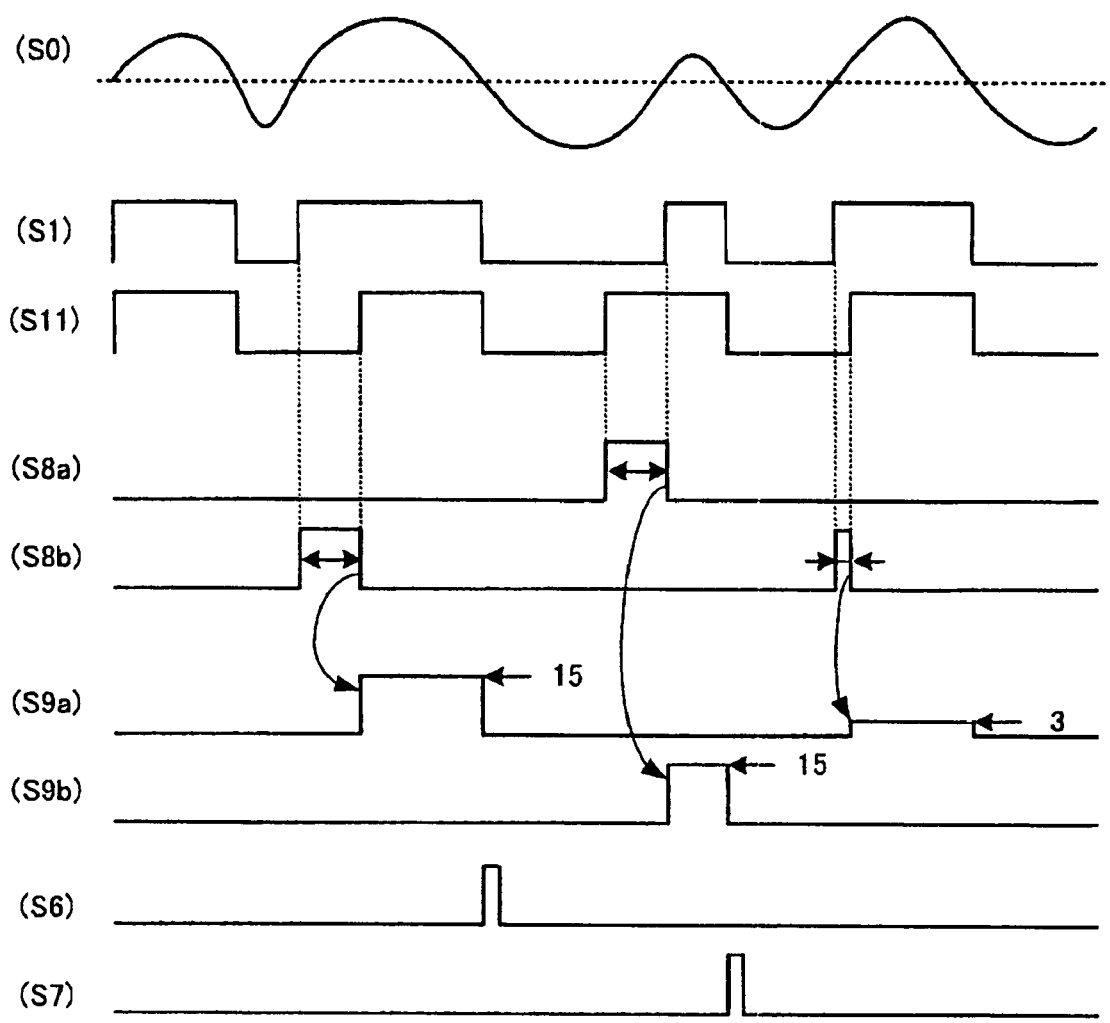
FIG. 3 shows the waveforms of internal signals to be supplied to respective components of the PLL clock generator shown in FIG. 2.

FIG. 2 is a block diagram showing a configuration for the PLL clock generator 107. As shown in FIG. 2, the PLL clock generator 107 preferably includes a binarizer 201, a phase comparator 202, a charge pump 209, a low pass filter (LPF) 203, a voltage-controlled oscillator (VCO) 204 and a frequency divider 206. In FIG. 2, the arrows identified by (S0), (S1) and so on represent respective signals, which are transferred between these blocks and the waveforms of which are shown in FIG. 3.

When the wobble signal (S0) is input to the PLL clock generator 107, the binarizer 201 preferably compares the level of the wobble signal with a predetermined zero level. If the level of the wobble signal (S0) is lower than the predetermined zero level, then the binarizer 201 preferably outputs "0". On the other hand, if the level of the wobble signal (S0) is equal to or higher than the predetermined zero level, then the binarizer 201 preferably outputs "1". In this manner, a binary signal (S1) can be obtained. The phase comparator 202 preferably compares a leading or trailing edge of the binary signal (S1) with the associated edge of the output signal (S1) of the frequency divider 206, thereby outputting a phase difference signal representing a phase difference between these two signals. More specifically, if a leading edge of the output signal (S11) of the frequency divider 206 is behind the associated edge of the binary signal (S1), then the phase comparator 202 preferably outputs an up signal (S8b), of which the pulse width represents the phase difference between these two signals. On the other hand, if a leading edge of the output signal (S11) of the frequency divider 206 is ahead of the associated edge of the binary signal (S1), then the phase comparator 202 preferably outputs a down signal (S8a), of which the pulse width represents the phase difference between these two signals.

In response to the down signal (S8a), the charge pump 209 preferably pumps out current from a capacitor in the LPF 203. On receiving the up signal (S8*b*) on the other hand, the charge pump 209 preferably pumps current into the capacitor.

The LPF 203 preferably smoothes out a voltage variation, caused by that pumping of current into or out of the capacitor by the charge pump 509, thereby outputting a smoothed control voltage (S4). In response to the control voltage (S4), the VCO 504 preferably outputs a wobble clock signal (S5), of which the frequency changes with the control voltage (S4).

The frequency divider 206 preferably divides the frequency of the wobble clock signal, thereby outputting the frequency-divided signal (S11) to the phase comparator 202. For example, in dividing the frequency of the wobble clock signal by 69, the frequency divider 206 preferably outputs a signal having a half period every time the frequency divider 206 has counted 69 wobble clock pulses. The output signal (S11) of the frequency divider 206 is preferably input to the phase comparator 202 and compared with the binary signal (S1) as described above. In this manner, a feedback loop L1 is formed. This loop L1 is used in a steady state in which the wobble clock signal output from the PLL clock generator 107 is substantially synchronized in phase with (i.e., locked to) the wobble signal or binary signal and in a quasi-steady state in which the phase difference between these signals is small enough to accomplish phase locking constantly.

On the other hand, if the phase difference between the wobble clock signal and the wobble signal or binary signal is relatively big, then a loop L2 is preferably used in addition to, or instead of, the loop L1 to accomplish phase locking quickly enough. For that purpose, the PLL clock generator 107 preferably further includes a synchronization detector 207, a time width detector 210, and a phase shifter 205. The synchronization detector 207 preferably detects the pulse widths of the up signal (S8*b*) or down signal (S8*a*) output from the phase comparator 202 during a certain period of time. If the sum of the pulse widths of the up or down signal (S8*b*) or (S8*a*) is equal to or greater than a predetermined value, then the synchronization detector 207 preferably senses an "asynchronous state" in which the wobble clock signal output from the frequency divider is not synchronous with the binary signal. On the other hand, if the sum is less than the predetermined value, then the synchronization detector 207 preferably senses a "synchronous state" including the steady state and the quasi-steady state. If the input wobble signal has a zero jitter while the PLL clock generator 107 is phase locking, neither the up signal (S8*b*) not the down signal (S8*a*) is output. That is to say, the sum of the pulse widths of the up signal or down signal becomes zero.

In the case where the PLL clock generator 107 is under the complete asynchronous state, the sum of the pulse widths of the up signal or down signal during the predetermined period of time becomes a half of the predetermined period. This is because the phase difference between the wobble clock signal and the binary signal disperses from the zero to one period at the same probability. Also, the sum of the pulse widths of the up signal or down signal becomes zero if the PLL clock generator is under the complete synchronous state and if the jitter is zero. Accordingly, the synchronization detector 207 preferably determines that the PLL clock generator 107 is under the synchronous state if the sum of the pulse widths of the up signal or down signal is less than the intermediate value between that of the synchronous state and that of the a asynchronous state (a half of the sum under the asynchronous state), i.e., less than a quarter of the predetermined period. Also, the synchronization detector 207 preferably determines that the PLL clock generator 107 is under the asynchronous state if the sum of the pulse widths of the up signal or down signal is at the quarter of the predetermined period or more. In this manner, the synchronization detector 207 preferably determines whether or not the PLL clock generator is in the asynchronous state. If the answer is YES, then the synchronization detector 207 preferably instructs the phase shifter 205 to operate.

The time width detector 210 preferably detects the pulse widths of the up signal (S8*b*) and those of the down signal (S8*a*), thereby outputting a positive phase difference signal (S9*a*) and a negative phase difference signal (S9*b*), respectively. That is to say, the amplitude of the positive phase difference signal (S9*a*) is associated with the sum of the pulse widths of the up signal (S8*b*), while the amplitude of the negative phase difference signal (S9*b*) is associated with the sum of the pulse widths of the down signal (S8*a*). For example, if the pulse widths of the up signal (S8*b*) is the sum of the widths of 15 clock pulses, then the positive phase difference signal (S9*a*) preferably has an amplitude corresponding to 15. On the other hand, if the pulse widths of the down signal (S8*a*) is the sum of the widths of 3 clock pulses, then the negative phase difference signal (S9*b*) preferably has an amplitude corresponding to 3.

While operating in accordance with the instruction given by the synchronization detector 207, the phase shifter 205 preferably outputs a phase lead signal (S6) or a phase lag signal (S7) if the amplitude of the positive or negative phase difference signal (S9*a*) or (S9*b*) supplied from the time width detector 210 is equal to or greater than a predetermined value. In this preferred embodiment, if the amplitude of the positive phase difference signal (S9*a*) is equal to or greater than the predetermined value, then the phase lead signal (S6) preferably increments the count of the frequency divider 206 by one pulse, thereby advancing the phase of the output signal of the frequency divider 206 by one clock pulse. On the other hand, if the amplitude of the negative phase difference signal (S9*b*) is equal to or greater than the predetermined value, then the phase lag signal (S7) preferably decrements the count of the frequency divider 206 by one pulse, thereby delaying the phase of the output signal of the frequency divider 206 by one clock pulse. The number of clock pulses to increment or decrement the count of the frequency divider 206 may be changed, and the degree of phase advancement or delay to be done on the output signal of the frequency divider 206 may be controlled, according to the amplitude of the positive or negative phase difference signal (S9*a*) or (S9*b*). Also, the number of pulses to be adjusted does not have to be an integer.

The phase comparator 202 preferably compares the phase-shifted output signal (S11) of the frequency divider 206 with the binary signal (S1), thereby outputting a phase difference signal as the down signal (S8*a*) or the up signal (S8*b*). As described above, the synchronization detector 207 preferably determines, by the sum of the pulse widths of the phase difference signal during the predetermined period of time, whether or not the PLL clock generator is in the asynchronous state. If the answer is YES, then the synchronization detector 207 preferably instructs the phase shifter 205 to operate. In this manner, the feedback loop L2 is formed.

By performing this feedback control using the loop L2 in parallel with the feedback control using the loop L1, the PLL clock generator 107 can establish its steady state in a shorter amount of time as compared with a situation where the feedback control is carried out only with the loop L1. That is to say, phase locking can be accomplished quickly enough. Also, even if the wobble signal is outside of the capture range of the loop L1 and if the phase of the wobble clock signal output from the VCO 204 cannot be controlled with the phase difference signal output from the phase comparator 202, a PLL control is still virtually accomplished by directly controlling the phase of the signal, obtained by dividing the frequency of the wobble clock signal, using the loop L2. As a result, the capture range of the PLL clock generator 107 can be expanded.

Figure 4:
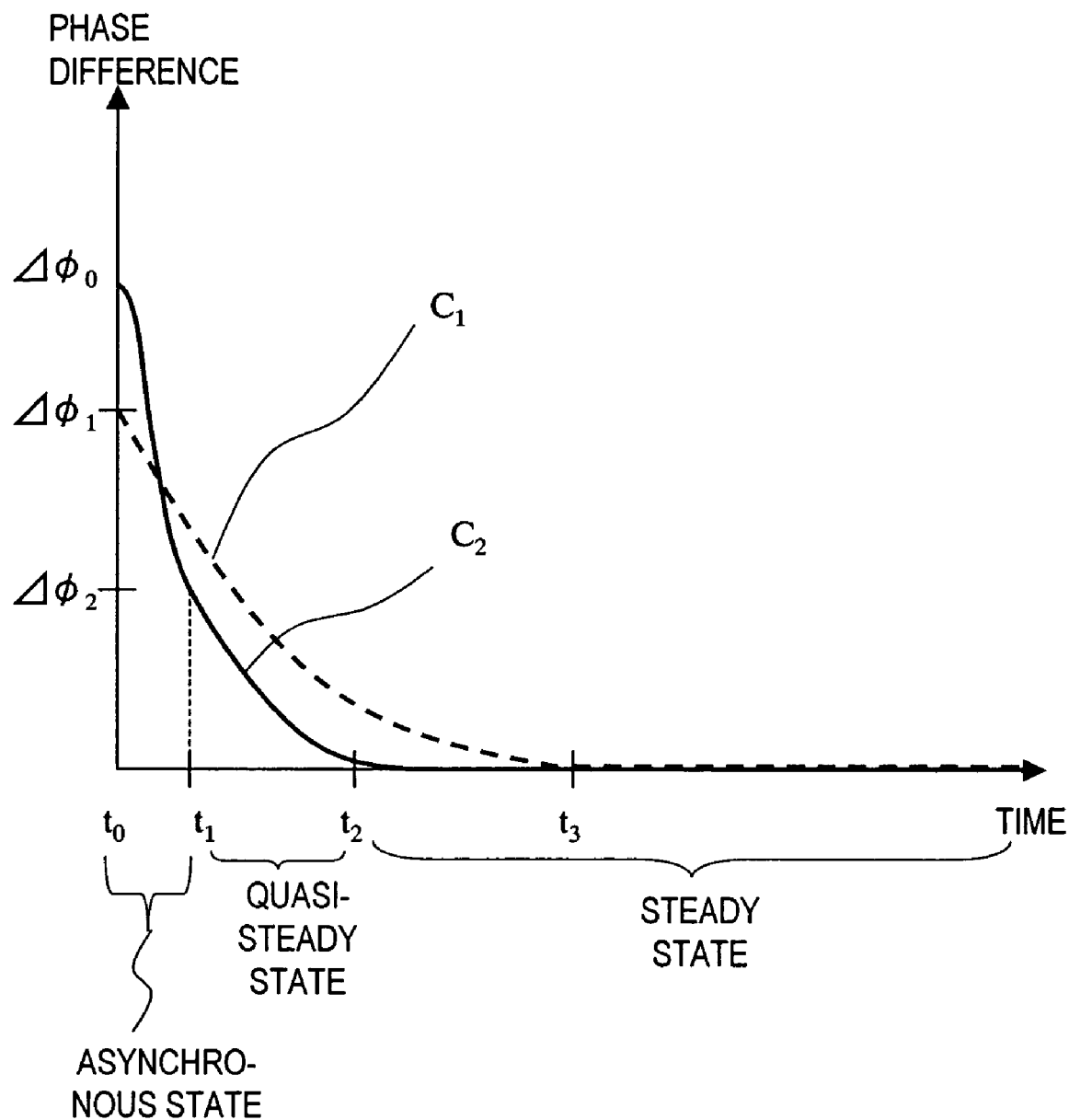
FIG. 4 is a graph schematically showing how the PLL clock generator performs a phase locking operation according to a preferred embodiment of the present invention.

FIG. 4 schematically shows how the phase difference between the binary signal (S1) being input to the phase comparator 202 of the PLL clock generator 107 and the output signal (S11) of the frequency divider 206 changes with time (as represented by the solid curve C2) and how (the absolute value of) the phase difference between the binary signal and the output signal of the frequency divider 506 changes with time in the conventional PLL clock generator 500 (as represented by the dashed curve C1).

The conventional PLL clock generator 500 carries out a PLL control using only the loop L1. As shown in FIG. 4, the maximum allowable phase difference that can be eliminated by the loop L1 is $\Delta\phi1$. That is to say, if the phase difference between the signal obtained by dividing the frequency of the initial signal output from the voltage-controlled oscillator 504 and the binary signal is greater than $\Delta\phi1$, the conventional PLL clock generator cannot generate any wobble clock signal that is synchronized with the binary signal. However, if the input binary signal has a phase difference of $\Delta\phi1$ or less, the conventional PLL clock generator can gradually decrease the phase difference by carrying out the feedback control using the loop L1. As a result, at a time t3, the phase difference between the signal obtained by dividing the frequency of the initial signal output from the voltage-controlled oscillator 504 and the binary signal becomes equal to zero, thus establishing a phase locking state.

In contrast, even if the phase difference between the signal obtained by dividing the frequency of the initial signal output from the voltage-controlled oscillator 204 and the binary signal (S1) is $\Delta\phi0$, which is greater than $\Delta\phi1$, the PLL clock generator 107 of this preferred embodiment can still accomplish phase locking. As shown in FIG. 4, if a binary signal with the phase difference of $\Delta\phi0$ is input, then the loop L1 cannot carry out any PLL feedback control because that phase difference is outside of the capture range of the loop L1. As a result, the frequency of the initial signal output from the voltage-controlled oscillator 204 does not change.

In that situation, the phase difference signal output from the phase comparator 202 has a large pulse width. Accordingly, the synchronization detector 207 finds the PLL clock generator 107 in the asynchronous state, thus instructing the phase shifter 205 to start to operate. Consequently, the loop L2 starts its feedback control. More specifically, in response to the positive or negative phase difference signal supplied from the time width detector 210, the phase shifter 205 preferably either increments or decrements the count of the frequency divider 206, thereby shifting the phase of the output signal (S11). As a result of this phase shifting, the phase difference signal output from the phase comparator 202 has a decreased pulse width. By controlling the phase of the signal (S11) repeatedly using the loop L2, the phase difference between the output signal of the voltage-controlled oscillator 204 and the binary signal (S1) gradually decreases. And once the phase difference becomes smaller than $\Delta\phi1$, the phase difference enters the capture range of the loop L1 and therefore the loop L1 starts its PLL control. Consequently, the wobble clock signal is subjected to both of the control operations by the loops L1 and L2, thus decreasing the phase difference steeply.

At a time t1 when the sum of the pulse widths of the phase difference signal output from the phase comparator 202 during the predetermined period of time becomes smaller than half of the value corresponding to the maximum allowable phase difference $\Delta\phi1$ for the loop L1, the synchronization detector 207 preferably senses that the PLL clock generator 107 is ready to accomplish phase locking and instructs the phase shifter 205 to stop operating. Thereafter, the PLL clock generator 107 preferably carries out a feedback control using only the loop L1 such that the wobble clock signal is synchronized in phase with the binary signal. By way of such a quasi-steady state produced by the PLL control with the loop L1 only, the wobble clock signal is completely synchronized in phase with the binary signal at a time t2. As a result, the PLL clock generator 107 enters its steady state and outputs a wobble clock signal at a constant frequency. By stopping the PLL control by the loop L2 during the quasi-steady and steady states, the stability in the steady state can be increased.

In this manner, according to the preferred embodiment described above, if the phase difference between the two signals to be compared by the phase comparator is relatively big, the feedback control loop L1 carried out by the same components as those of the conventional PLL clock generator is preferably replaced by the feedback control loop L2. In this feedback control loop L2, the phase of the output signal of the frequency divider is preferably controlled directly and there is no need to change the characteristic of the charge pump or low pass filter. As a result, it is possible to prevent the PLL clock generator from increasing its circuit scale.

Also, in the conventional feedback control loop L1, some tradeoff is inevitable between the expansion of the capture range and the jitter minimization of the wobble clock signal, and therefore, it is difficult to achieve these two objects at the same time. In contrast, according to the preferred embodiment of the present invention, the capture range can be expanded by the loop L2. Accordingly, by designing the low pass filter such that the loop L1 minimizes the jitter of the wobble clock signal, these two objects can be easily achieved at the same time. Furthermore, by using these two loops L1 and L2 in parallel, phase locking can also be done quickly enough. For that reason, the loop L1 may also have a decreased gain, an increased phase margin and improved stability.

EMBODIMENT 2

Figure 5:
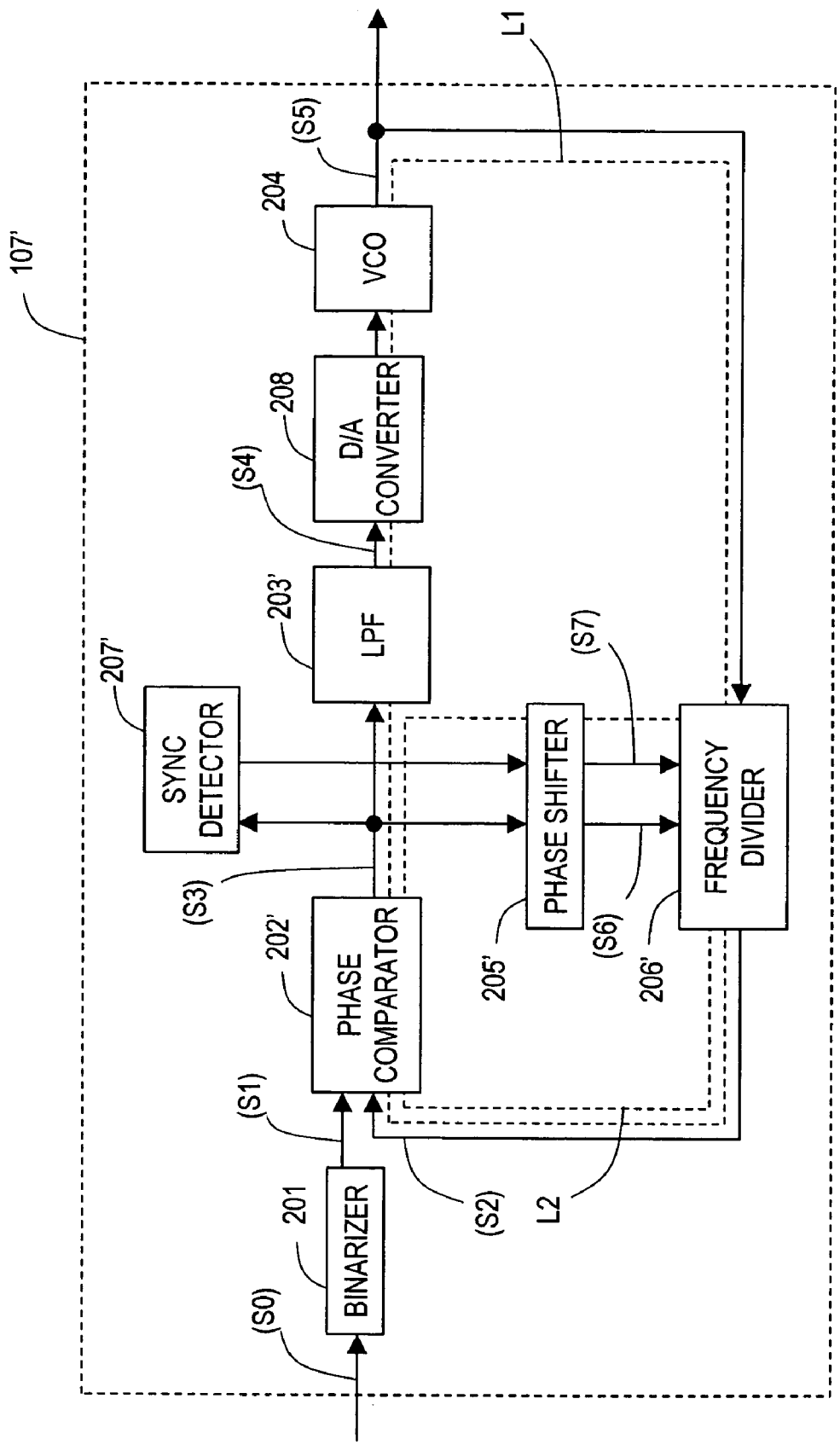
FIG. 5 is a block diagram showing a configuration for a PLL clock generator according to a second specific preferred embodiment of the present invention.
Figure 6:
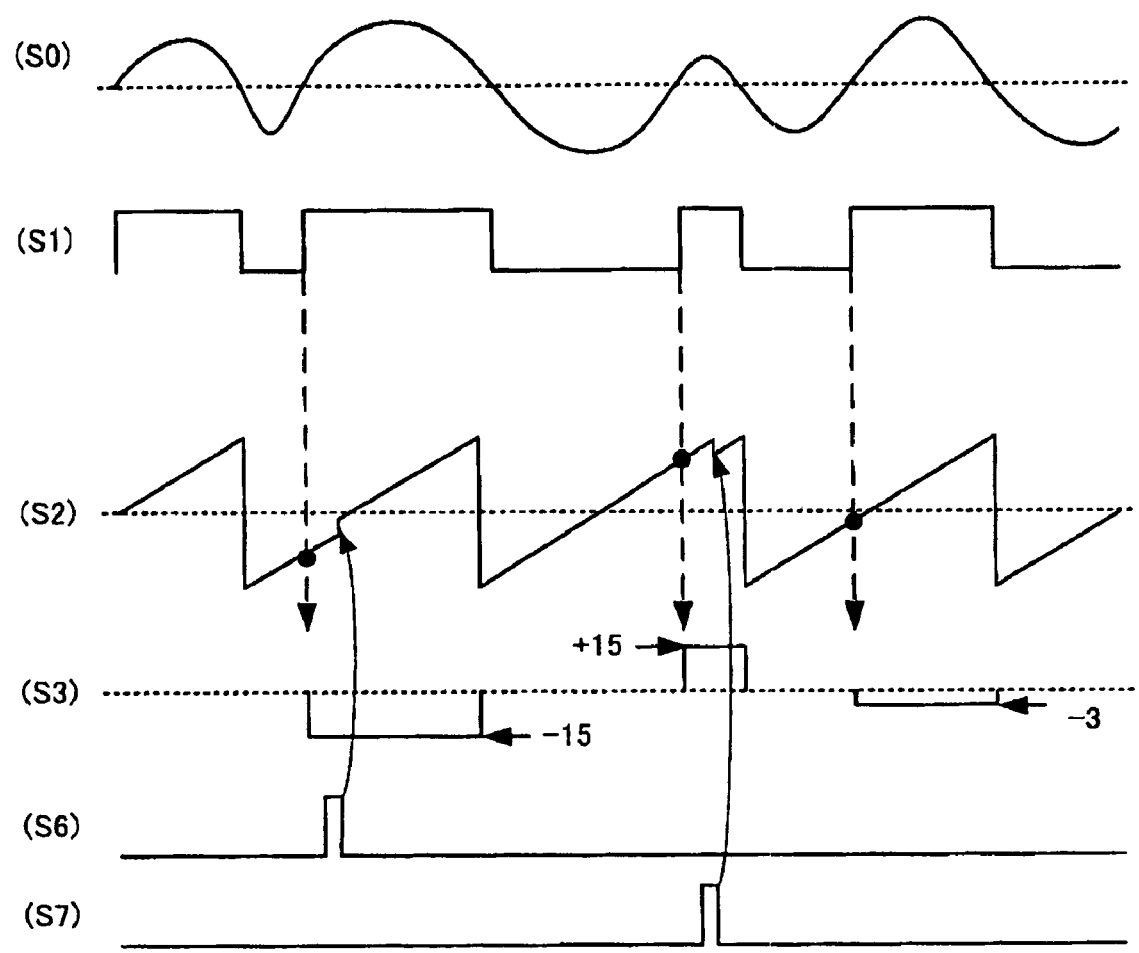
FIG. 6 shows the waveforms of internal signals to be supplied to respective components of the PLL clock generator shown in FIG. 5.
Figure 7:
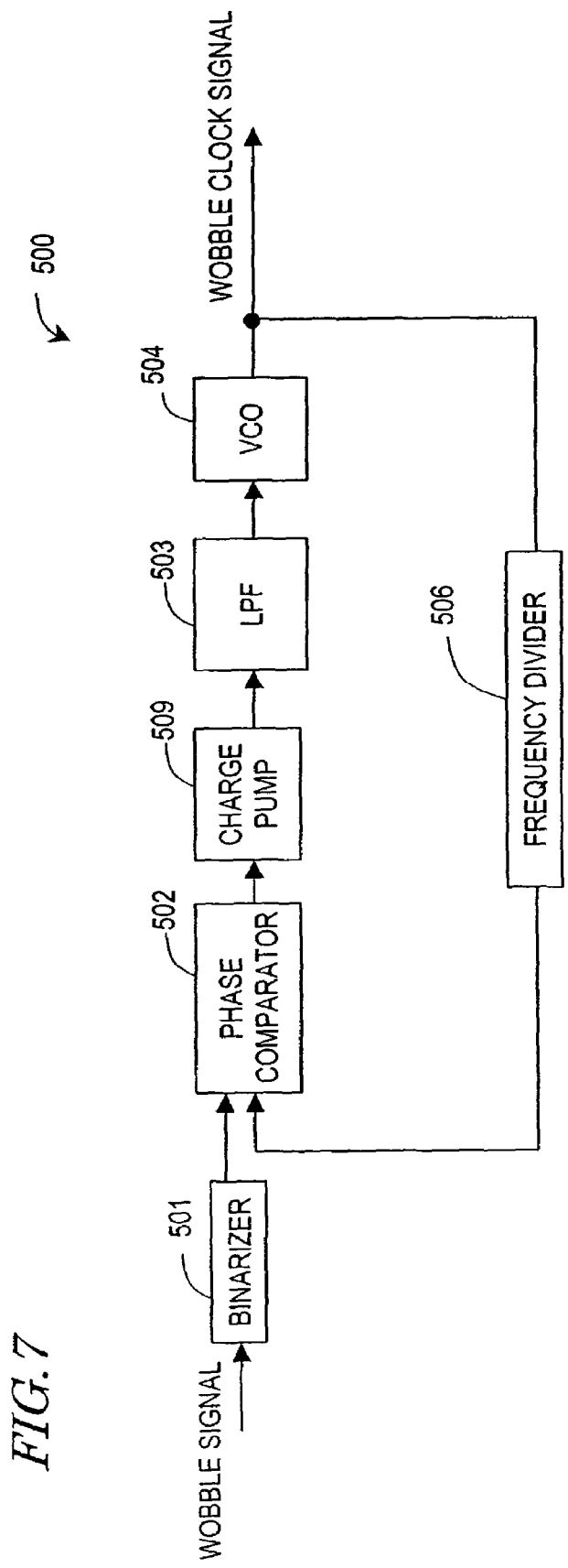
FIG. 7 is a block diagram showing a configuration for a conventional PLL clock generator.

FIG. 5 is a block diagram showing a configuration for a PLL clock generator according to a second specific preferred embodiment of the present invention. Just like the PLL clock generator 107 of the first preferred embodiment described above, the PLL clock generator 107' of this second preferred embodiment can also be used effectively as the PLL clock generator 107 of the optical disc drive 100. FIG. 6 shows the waveforms of internal signals for respective components of the PLL clock generator 107' shown in FIG. 5. As in the first preferred embodiment described above, the PLL clock generator 107' preferably also performs feedback controls using the loops L1 and L2 and preferably generates a wobble clock signal from a wobble signal. However, the second preferred embodiment is different from the first preferred embodiment in that part of signal processing by the loop L1 and all of signal processing by the loop L2 are carried out by using digital signals.

As shown in FIG. 5, the PLL clock generator 107' preferably includes the binarizer 201, a phase comparator 202', a low pass filter (LPF) 203', a D/A converter 208, the voltage-controlled oscillator (VCO) 204, and a frequency divider 206'. As in the first preferred embodiment described above, the arrows identified by (S0), (S1) and so on in FIG. 6 represent respective signals, which are transferred between these blocks and the waveforms of which are shown in FIG. 6.

As in the first preferred embodiment described above, when the wobble signal (S0) is input to the PLL clock generator 107', the binarizer 201 preferably compares the level of the wobble signal with a predetermined zero level. If the level of the wobble signal (S0) is lower than the predetermined zero level, then the binarizer 201 preferably outputs "0". On the other hand, if the level of the wobble signal (S0) is equal to or higher than the predetermined zero level, then the binarizer 201 preferably outputs "1". In this manner, a binary signal (S1) can be obtained.

On the other hand, the frequency divider 206' preferably receives a wobble clock signal (S5) and divides its frequency, thereby outputting a signal (S2) including multi-bit digital phase information. For example, in dividing the frequency of the wobble clock signal (S5) by 69, the frequency divider 206' preferably counts the number of pulses of the wobble clock signal (S5), thereby outputting the counts as multi-bit digital values representing decimal values of −34 through +34.

The phase comparator 202' preferably compares a leading or trailing edge of the binary signal (S1) with the associated edge of the output signal (S2) of the frequency divider 206', thereby outputting a phase difference signal (S3) representing a phase difference between these two signals. Next, the phase difference signal (S3) is preferably smoothed by the LPF 203' so as to turn into a frequency controlled signal (S4). The D/A converter 208 preferably converts the frequency controlled signal (S4) into an analog signal and then passes it to the VCO 204. In response, the VCO 204 preferably outputs a signal, having a frequency corresponding to the applied voltage, as the wobble clock signal (S5). Then, the wobble clock signal (S5) is preferably input to the frequency divider 206' and the number of its pulses is counted there.

In this manner, in the loop L1 of the PLL clock generator 107', the output signal (S2) of the frequency divider 206', the phase difference signal (S3) and the signal (S4) that has passed the LPF 203' are preferably processed as digital signals.

To make up another loop L2, the PLL clock generator 107' preferably further includes a synchronization detector 207' and a phase shifter 205'. The synchronization detector 207' preferably obtains the sum of the absolute values of the phase difference signal (S3) output from the phase comparator 202' in a predetermined period of time. If the summation value is equal to or greater than a predetermined value, then the synchronization detector 207' detects an "asynchronous state" in which the wobble clock signal output from the frequency divider 206' is not synchronized with the binary signal. On the other hand, if the summation value is less than the predetermined value, then the synchronization detector 207' senses a "synchronous state" including a steady state and a quasi-steady state. If the input wobble signal has a zero jitter in the state in which the PLL clock generator 107' has accomplished phase locking, then a leading edge of the binary signal (S1) should be synchronous with a time at which the output signal (S2) of the frequency divider 206' crosses zero. Thus, the phase difference signal (S3) becomes zero, too, at that time.

As explained in EMBODIMENT 1, in the case where the sum of the absolute values of the phase difference signal (S3) is less than a half of the sum obtained under the complete asynchronous state, the synchronization detector 207' preferably determines that the PLL clock generator 107' is under the synchronous state. Also, the synchronization detector 207' preferably determines that the PLL clock generator 107' is under the asynchronous state, in the case where the sum of the absolute values of the phase difference signal (S3) is equal to or more than a half of the sum obtained under the complete asynchronous state. In this manner, the synchronization detector 207' preferably determines whether or not the PLL clock generator is in the asynchronous state. If the answer is YES, then the synchronization detector 207 preferably instructs the phase shifter 205 to operate.

The phase shifter 205' preferably outputs either a phase lead signal (S6) or a phase lag signal (S7) according to the polarity of the phase difference signal if the absolute value of the phase difference signal (S3) is equal to or greater than a predetermined value. In this preferred embodiment, if the absolute value is 10 or more, for example, then the phase lead signal (S6) or phase lag signal (S7) is preferably output to increment or decrement the count of the frequency divider 206' by one clock pulse. As shown in FIG. 6, the frequency divider 206' preferably increments the count by one clock pulse in response to the phase lead signal (S6), thus advancing the phase of the output signal (S2) by one clock pulse. On the other hand, in response to the phase lag signal (S7), the frequency divider 206' preferably decrements the count by one clock pulse, thus delaying the phase of the output signal (S2) by one clock pulse. The number of clock pulses to increment or decrement the count of the frequency divider 206' may be changed, and the degree of phase advancement or delay to be done on the output signal of the frequency divider 206' may be controlled, according to the absolute value of the phase difference signal (S3).

The phase comparator 202' preferably compares the phase-shifted output signal (S2) of the frequency divider 206' with the binary signal (S1), thereby outputting the phase difference signal (S3). As described above, the synchronization detector 207' preferably determines, by the sum of the absolute values of the phase difference signal during the predetermined period of time, whether or not the PLL clock generator is in the asynchronous state. If the answer is YES, then the synchronization detector 207' preferably instructs the phase shifter 205' to start to operate. In this manner, the feedback control loop L2 is formed.

As in the first preferred embodiment described above, by performing this feedback control using the loop L2 in parallel with the feedback control using the loop L1, the PLL clock generator 107' can establish its steady state in a shorter amount of time as compared with a situation where the feedback control is carried out only with the loop L1. That is to say, phase locking can be accomplished quickly enough. Also, even if the wobble signal is outside of the capture range of the loop L1 and if the phase of the wobble clock signal output from the VCO 204 cannot be controlled with the phase difference signal output from the phase comparator 202', a PLL control is still virtually accomplished by directly controlling the phase of the signal, obtained by dividing the frequency of the wobble clock signal, using the loop L2. As a result, the capture range of the PLL clock generator 107' can be expanded. In addition, the loop L1 can have a decreased gain and increased stability.

As described above, a PLL clock generator according to any of the preferred embodiments of the present invention described above can be used effectively in an optical disc drive. By applying the present invention, an optical disc drive for generating a wobble clock signal constantly from an optical disc, on which tracks have their wobbling periods discontinued by the addition of address information, for example, can be obtained.

In the preferred embodiments described above, each of those functional blocks is normally implemented as a hardware component consisting of known electronic circuits, for example. By using those hardware components, a high-speed processing PLL clock generator can be provided. However, some of those blocks may be implemented by software, too.

Also, in the preferred embodiments described above, the PLL clock generator preferably includes a binarizer for digitizing an incoming analog wobble clock signal. Alternatively, the binarizer may be provided outside of the PLL clock generator such that a binary signal is input to the PLL clock generator.

Furthermore, in the preferred embodiments described above, not every functional block has to constitute a single integrated circuit but a number of functional blocks may be combined together as a single integrated circuit. For example, in the preferred embodiment shown in FIG. 1, the servo controller 104, PLL controller 112, bandpass filter 106, PLL clock generator 107, timing generator 108 and write signal generator 109 may be integrated together in a single chip as an optical disc controller (ODC).

A PLL clock generator according to any of various preferred embodiments of the present invention described above can be used effectively in an optical disc drive and numerous other types of apparatuses.

This application is based on Japanese Patent Applications No. 2003-115547 filed on Apr. 21, 2003 and No. 2004-116347 filed on Apr. 12, 2004, the entire contents of which are hereby incorporated by reference.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A PLL clock generator for generating an output signal, of which the frequency is N times (where N is a natural number equal to or greater than 1) as high as that of an input signal, the clock generator comprising:
   a frequency divider for counting a clock signal and dividing the frequency of the clock signal by N so as to output a frequency-divided clock signal;
   a phase comparator for detecting a phase difference between the input signal and the output signal of the frequency divider so as to output a phase difference signal including information representing the phase difference;
   a low pass filter for smoothing the phase difference signal;
   a voltage-controlled oscillator for generating the clock signal, of which the frequency is determined by the output of the low pass filter, and outputting the clock signal to the frequency divider;
   a time width detector for outputting a positive phase difference signal and a negative phase difference signal based on the phase difference signal; and
   a phase shifter for advancing the count of the frequency divider if the amplitude of the positive phase difference signal is equal to or greater than a first predetermined value and delaying the count of the frequency divider if the amplitude of the negative phase difference signal is equal to or greater than a second predetermined value so as to change the phase of the output signal of the frequency divider.

2. The PLL clock generator of claim 1, wherein the frequency divider, the phase comparator, the low pass filter and the voltage-controlled oscillator together makes up a first feedback loop, and
   wherein the frequency divider, the phase shifter and the phase comparator together make up a second feedback loop.

3. A PLL clock generator of claim 1, further comprising a synchronization detector for determining a synchronization state of a PLL based on the phase difference signal and for instructing the phase shifter to operate in the case of an asynchronous state.

4. The PLL clock generator of claim 3, wherein the synchronization detector sums up the absolute values of the phase differences, obtained from the phase comparator, for a predetermined period of time and instructs the phase shifter to start to operate if a resultant summation value is equal to or greater than the predetermined value.

5. The PLL clock generator of claim 3, further comprising a binarizer for outputting a binary signal by comparing an incoming analog signal with a predetermined signal level,
   wherein the input signal is the binary signal.

6. The PLL clock generator of claim 1, further comprising a binarizer for outputting a binary signal by comparing an incoming analog signal with a predetermined signal level,
   wherein the input signal is the binary signal.

7. An optical disc drive for reading and/or writing data from/on an optical disc with wobbled tracks, the optical disc drive comprising:
   an optical head for focusing light on one of the tracks and receiving the light that has been reflected from the track;
   a wobble signal generator for generating a wobble signal from an output signal of the optical head; and
   a PLL clock generator for receiving the wobble signal and generating an output signal, of which the frequency is N times (where N is a natural number equal to or greater than 1),
   wherein the PLL clock generator comprises:
   a frequency divider for counting a clock signal and dividing the frequency of the clock signal by N so as to output a frequency-divided clock signal;
   a binarizer for receiving the wobble signal and for outputting a binary signal by comparing the wobble signal with a predetermined signal level,
   a phase comparator for receiving the binary signal and detecting a phase difference between the binary signal and the output signal of the frequency divider so as to output a phase difference signal including information representing the phase difference;
   a low pass filter for smoothing the phase difference signal;
   a voltage-controlled oscillator for generating the clock signal, of which the frequency is determined by the output of the low pass filter, and outputting the clock signal to the frequency divider;
   a time width detector for outputting a positive phase difference signal and a negative phase difference signal based on the phase difference signal; and a phase shifter for advancing the count of the frequency divider if the amplitude of the positive phase difference signal is equal to or greater than a first predetermined value and delaying the count of the frequency divider if the amplitude of the negative phase difference signal is equal to or greater than a second predetermined value so as to change the phase of the output signal of the frequency divider.

8. The optical disc drive of claim 7, wherein the wobbled tracks of the optical disc are modulated so as to represent address information.

9. An optical disc controller being used for an optical disc drive and including the PLL clock generator for receiving an input signal and for generating an output signal, of which the frequency is N times (where N is a natural number equal to or greater than 1) as high as that of the input signal, wherein the PLL clock generator comprises:
- a frequency divider for counting a clock signal and dividing the frequency of the clock signal by N so as to output a frequency-divided clock signal;
- a phase comparator for receiving the input signal and detecting a phase difference between the input signal and the output signal of the frequency divider so as to output a phase difference signal including information representing the phase difference;
- a low pass filter for smoothing the phase difference signal;
- a voltage-controlled oscillator for generating the clock signal, of which the frequency is determined by the output of the low pass filter, and outputting the clock signal to the frequency divider;
- a time width detector for outputting a positive phase difference signal and a negative phase difference signal based on the phase difference signal; and
- a phase shifter for advancing the count of the frequency divider of the amplitude of the positive phase difference signal is equal to or greater than a first predetermined value and delaying the count of the frequency divider if the amplitude of the negative phase difference signal is equal to or greater than a second predetermined value so as to change the phase of the output signal of the frequency divider.

10. A method for controlling a PLL clock generator, the PLL clock generator receiving an input signal with a predetermined frequency and generating an output signal, of which the frequency is N times (where N is a natural number equal to or greater than 1) as high as the predetermined frequency, wherein a first feedback loop is made up with a frequency divider for counting a clock signal and dividing the frequency of the clock signal by N so as to output a frequency-divided clock signal; a phase comparator for receiving the input signal and detecting a phase difference between the input signal and the output signal of the frequency divider so as to output a phase difference signal including information representing the phase difference; a low pass filter for smoothing the phase difference signal; and a voltage-controlled oscillator for generating the clock signal of which the frequency is determined by the output of the low pass filter, and outputting the clock signal to the frequency divider;

wherein a time width detector outputs a positive phase difference signal and a negative phase difference signal based on the phase difference signal, wherein if the first feedback loop is under an asynchronous state, the method includes the step of controlling a phase shifter which advances the count of the frequency divider if the amplitude of the positive phase difference signal is equal to or greater than a first predetermined value and delays the count of the frequency divider if the amplitude of the negative phase difference signal is equal to or greater than a second predetermined value so as to change the phase of the output signal of the frequency divider, whereby the frequency divider, the phase shifter and the phase comparator make up a second feedback loop.

\* \* \* \* \*